United States Patent [19]

Shortes et al.

[11] 4,027,686
[45] June 7, 1977

[54] METHOD AND APPARATUS FOR CLEANING THE SURFACE OF A SEMICONDUCTOR SLICE WITH A LIQUID SPRAY OF DE-IONIZED WATER

[75] Inventors: Samuel R. Shortes, Plano; Edwin Graham Millis, Dallas, both of Tex.

[73] Assignee: Texas Instruments Incorporated, Dallas, Tex.

[22] Filed: Jan. 2, 1973

[21] Appl. No.: 320,400

[52] U.S. Cl. .................................. 134/33; 134/30; 134/95; 134/102; 134/153
[51] Int. Cl.² ........................ B08B 3/00; B08B 3/04
[58] Field of Search ................. 134/21, 26, 33, 37, 134/95, 34, 99, 102, 110, 111, 153, 30, 57 DL, 58 DL; 15/302; 148/1.5; 156/17

[56] References Cited
UNITED STATES PATENTS

| | | | |
|---|---|---|---|
| 2,948,642 | 8/1960 | MacDonald | 148/1.5 |
| 3,012,921 | 12/1961 | Vaughan | 134/102 X |
| 3,041,225 | 6/1962 | Emels | 134/33 X |
| 3,062,227 | 11/1962 | Soderberg | 134/21 X |
| 3,479,222 | 11/1969 | David et al. | 134/33 |
| 3,489,608 | 1/1970 | Jacobs | 134/25 |
| 3,727,620 | 4/1973 | Orr | 134/95 |
| 3,760,822 | 9/1973 | Evans | 134/99 |
| 3,776,800 | 12/1973 | Goffredo et al. | 134/111 X |

*Primary Examiner*—S. Leon Bashore
*Assistant Examiner*—Steve Alvo
*Attorney, Agent, or Firm*—Harold Levine; James T. Comfort; William E. Hiller

[57] ABSTRACT

Method and apparatus for cleaning the surface of a slice of semiconductor material through the use of a liquid spray, wherein the liquid spray is delivered at an angle to the exposed surface of a rotating semiconductor slice at a controlled pressure and velocity, and strikes the surface of the semiconductor slice substantially along a linear path coinciding with the diameter of the slice. The apparatus includes an upstanding pedestal having a slice-supporting surface on which the slice of semiconductor material to be cleaned is disposed. The pedestal is mounted within a housing which includes a motor for imparting rotation to the pedestal and a vacuum pump for inducing a suction in openings provided in the slice-supporting surface of the pedestal so as to retain the slice in place when rotary movement is imparted thereto. A spray nozzle for delivering a flat fan-shaped spray pattern is disposed within the housing, the spray nozzle being positioned above the level of the slice-supporting surface for dispensing a liquid spray onto the exposed surface of the slice positioned thereon. The housing is also provided with a transparent dome-shaped cover overlying the upstanding pedestal and the spray nozzle to define a cleaning chamber. The cover in its closed position completes an electric circuit operating the motor and the vacuum pump to impart rotation to the pedestal and to retain the semiconductor slice upon the surface of the pedestal by inducing suction in the openings provided therein. De-ionized water is delivered from the spray nozzle as a liquid spray to the surface of the semiconductor slice at a high pressure and velocity to produce a corona discharge for effecting a cleaning operation of the exposed surface of the semiconductor slice wherein particulate surface debris of a particle size smaller than the width of the theoretically determined dead space layer associated with the exposed slice surface is removed therefrom.

8 Claims, 7 Drawing Figures

METHOD AND APPARATUS FOR CLEANING THE SURFACE OF A SEMICONDUCTOR SLICE WITH A LIQUID SPRAY OF DE-IONIZED WATER

This invention relates to a method and apparatus for cleaning the surface of a body to a degree substantially eliminating the presence of foreign matter on the surface thereof, in particular for cleaning the surface of a slice of semiconductor material such as silicon. Specifically, the method and apparatus according to the present invention involve the delivery of a liquid spray to the exposed surface of a rotating semiconductor slice at a controlled pressure and velocity of such magnitude to effect a cleaning operation thereon removing particulate surface debris of a particle size smaller than the width of the theoretically determined dead space layer associated with the exposed slice surface.

In the processing of semiconductor material in the form of substrates, slices, wafers or the like, for manufacturing semiconductor devices, the accumulation of surface debris on the bodies of such semiconductor material is virtually certain. This surface debris or foreign matter may act as a contaminant having a direct adverse effect on the semiconductor device to be made from the body of semiconductor material hampering or preventing the desired operating performance therefrom, thereby lowering the yield of commercially acceptable semiconductor devices from the manufacturing process being employed. Consequently, it is customary to include a cleaning stage in such manufacturing processes, wherein the bodies of semiconductor material, such as slices of silicon, are subjected to a cleaning treatment for removing accumulated surface debris therefrom.

Heretofore, a typical method employed for this purpose is one which might be characterized as a "spin-swab" method in which cleaning liquid is dribbled down onto a semiconductor slice, and thereafter the slice is subjected to a wiping action from the central portion thereof radially outwardly with a moistened cotton swab. Although this method is capable of generally satisfactory cleaning of the semiconductor slice, it is subject to certain shortcomings in that the wiping action on the surface of the semiconductor slice by the cotton swab may have a tendency to abrade the surface of the semiconductor slice as the particulate surface debris is removed therefrom by the wiping action. Moreover, this "spin-swab" method while normally satisfactory for removing surface debris from the major portion of the surface area of the semiconductor slice often results in the accumulation of such particulate surface debris along the marginal edge of the slice which frequently escapes detection upon inspecting the polished surface of the semiconductor slice by means of dark-field microscopy. These undetected residual particles have a tendency to migrate back toward the central portion of the polished surface of the semiconductor slice during the subsequent processing thereof with attendant adverse effects of the type hereinbefore described.

A further difficulty encountered in the use of the "spin-swab" method occurs where the semiconductor slice to be cleaned has a patterned oxide layer thereon or other surface irregularities. In such instances, the surface debris present on the surface of the semiconductor slice to be cleaned, instead of being removed is more often deposited in the minute depressions and crevices offered by the irregular slice surface.

Other methods heretofore employed for cleaning the surfaces of semiconductor slices have included simple blowing and spraying of such surfaces by fluid and liquid mediums, wherein the particulate surface debris is intended to be removed therefrom by the kinetic momentum of the fluid or liquid used. However, simple blowing and spraying of the surface of the semiconductor slice to be cleaned is not sufficiently effective to remove particulate surface debris where the particle size is equal to or smaller than the width of a theoretically determined dead space layer associated with the slice surface. In this respect, the velocity of a fluid directed at a solid body is zero at the surface of the solid body in all fluid flow situations. In the immediate vicinity of the surface of the solid body, the velocity of the fluid rapidly approaches the velocity of the main fluid stream in a region known as the boundary layer. Where a particle on the surface of the body is of sufficiently small size, a region exists adjacent to the body surface where the momentum of the fluid directed against the surface is not large enough to overcome the adherence of the small particle to the surface. As stated, this region is the so-called boundary layer or dead space layer. As applied to the attempted cleaning of a semiconductor slice by simple blowing or spraying, the maximum size debris particle which will stay attached to the surface of the slice will be some fraction of the height of the boundary layer or dead space layer associated with the slice surface, the value of this fraction depending upon the density of the fluid or liquid, the degree of adherence of the particle to the surface, and the aerodynamic drag characteristic of the particle. In any event, the success enjoyed by conventional practices of blowing the surface with a fluid or spraying the surface with a liquid in the cleaning of slices of semiconductor material, such as silicon, has been limited in that surface debris having a particle size smaller than the width of the theoretically determined dead space layer associated with the slice surface has remained thereon as a contaminating source due to the inability of the fluid blowing or liquid spraying to remove such particles from the surface.

Retained particulate surface debris on semiconductor slices is often responsible for a significant increase in the pinhole count of slices which are subsequently coated with photoresist and thereafter exposed to an etching procedure in producing a patterned oxide or metallized layer. This increased pinhole count where accumulated particulate surface debris remains on the slice surface as more markedly apparent as the layer of the photoresist coating becomes thinner. In this connection, it has been determined that photoresist films above 6,000 – 7,000 A in thickness present curing problems of a character tending to cause staining in the windows formed in the photoresist film as an etching procedure is being carried out thereon. Thick photoresist films also cause resolution problems in patterning such films by etching. Thus, thinner photoresist films have a beneficial effect on the etching procedure in improving its reliability. However, the thinner photoresist films may be responsible for increased pinhole counts in subsequently formed oxide layers or metal layers in the absence of an effective cleaning procedure for removing accumulated particulate surface debris from the semiconductor slice surface. A high pinhole count on processed slices is another factor adversely affecting the yield of commercially acceptable semiconductor devices from the manufacturing process.

In accordance with the present invention, an improved method of cleaning the surface of a semiconductor slice by directing a liquid spray thereagainst and an apparatus for practicing the method are provided, wherein the cleaning operation afforded thereby is effective to remove surface debris of a particle size smaller than the width of the theoretically determined dead space layer or boundary layer associated with the exposed slice surface. In this connection, the method and apparatus involve the delivery of a liquid spray, preferably de-ionized water, to the surface of a rotating semiconductor slice at a controlled pressure and velocity with the liquid spray striking the surface of the semiconductor slice at a predetermined angle with respect thereto. In a preferred embodiment of the invention, the liquid spray is delivered to the slice surface at an angle lying within the range of 20° to 60° at a pressure within the range of 4,000 – 6,000 pounds per square inch and a velocity in the range of 150 – 200 feet per second. The de-ionized water spray is delivered from a spray-dispensing nozzle in a flat fan-shaped pattern to strike the surface of the rotating semiconductor slice along a substantially linear path coinciding with the diameter of the slice and is effective for removing particulate surface debris of a particle size smaller than the width of the theoretically determined dead space layer or boundary layer associated with the slice surface, the cleaning of the slice surface as so accomplished being accompanied by a bluish-appearing corona discharge visible in the region of the slice surface. More specifically, the apparatus includes an upstanding pedestal which provides a slice-supporting surface, the pedestal being operably associated with a motor for imparting rotation thereto and a vacuum pump for inducing suction through openings provided in the slice-supporting surface of the pedestal. The operation of the motor and the vacuum pump is synchronized with the opening and closing of a transparent dome-shaped cover which defines a cleaning chamber for the pedestal and a liquid spray-dispensing nozzle. The spray-dispensing nozzle is disposed above the level of the slice-supporting surface within the cleaning chamber, along with a pair of nozzles for respectively delivering a liquid rinsing stream and a fluid drying stream in timed succession after the liquid spray cleaning phase to complete the cleaning cycle for the semiconductor slice. Upon moving the transparent dome-shaped cover to closed position, the motor and the vacuum pump are operated to impart rotation to the upstanding pedestal and the slice-supporting surface thereof while inducing suction through the openings provided in the slice-supporting surface for retaining the semiconductor slice to be cleaned thereon.

The objects and advantages of the invention will be better understood from the following description when read in connection with the accompanying drawings in which.

Figure 6:
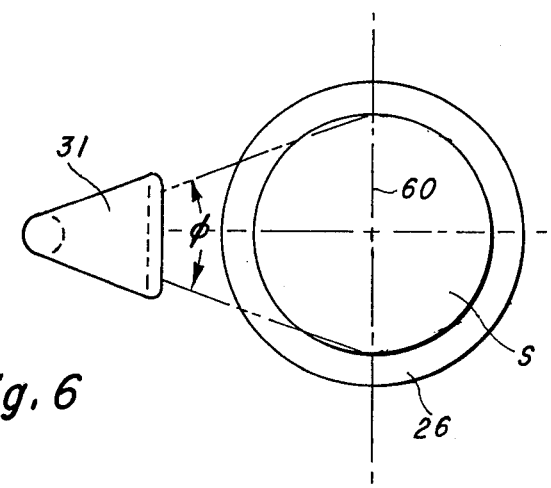
Figure 7:
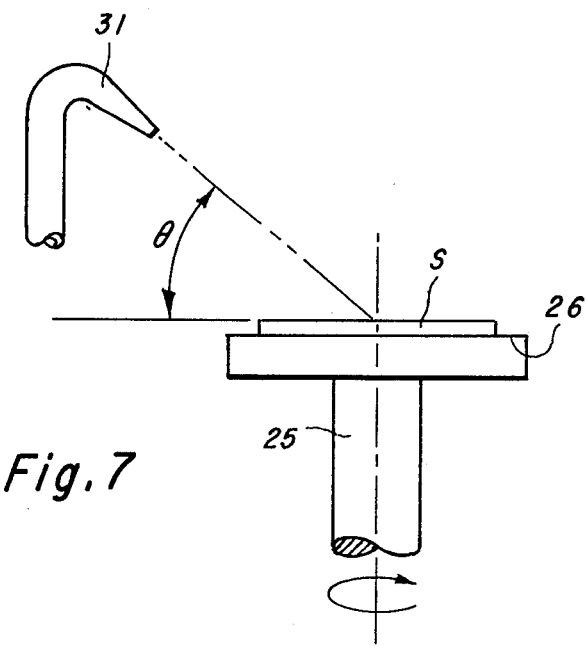

FIG. 6 is a greatly enlarged schematic view showing the spray nozzle and the liquid spray pattern provided thereby in relation to the surface of the semiconductor slice to be cleaned; and FIG. 7 is a greatly enlarged schematic view similar to FIG. 6 but oriented 90° with respect thereto to illustrate the angular relationship between the liquid spray dispensing nozzle and the surface of the semiconductor slice to be cleaned.

Figure 1:
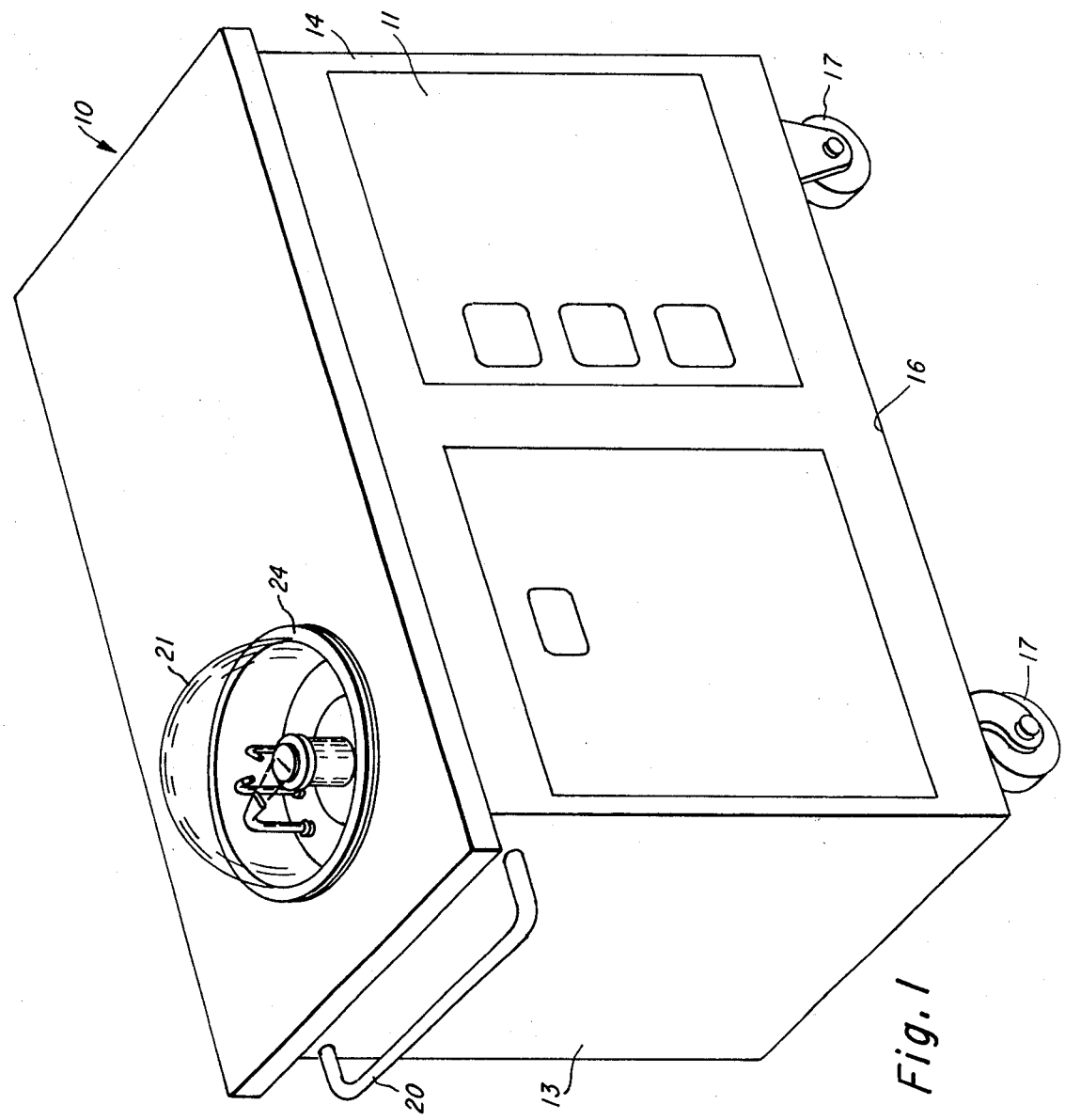
FIG. 1 is a perspective view of an apparatus for cleaning the surface of a semiconductor slice in accordance with the present invention.

Referring more specifically to the drawings, FIG. 1 illustrates an apparatus constructed in accordance with the present invention and adapted to effect a cleaning operation on the surface of a body for removing accumulated debris in the nature of foreign matter and/or particulate residue therefrom. The apparatus comprises a housing 10 in the form of a cabinet including front and rear walls 11, 12, end walls 13, 14, and top and bottom walls 15, 16, respectively. The housing 10 is equipped with appropriate wheels or casters 17 suitably mounted on the bottom wall 16 thereof to provide mobility for the apparatus. In this respect, a handle 20 is mounted on the end wall 13 adjacent its juncture with the top wall 15 of the housing 10 to facilitate the movement of the wheeled apparatus.

Figure 3:
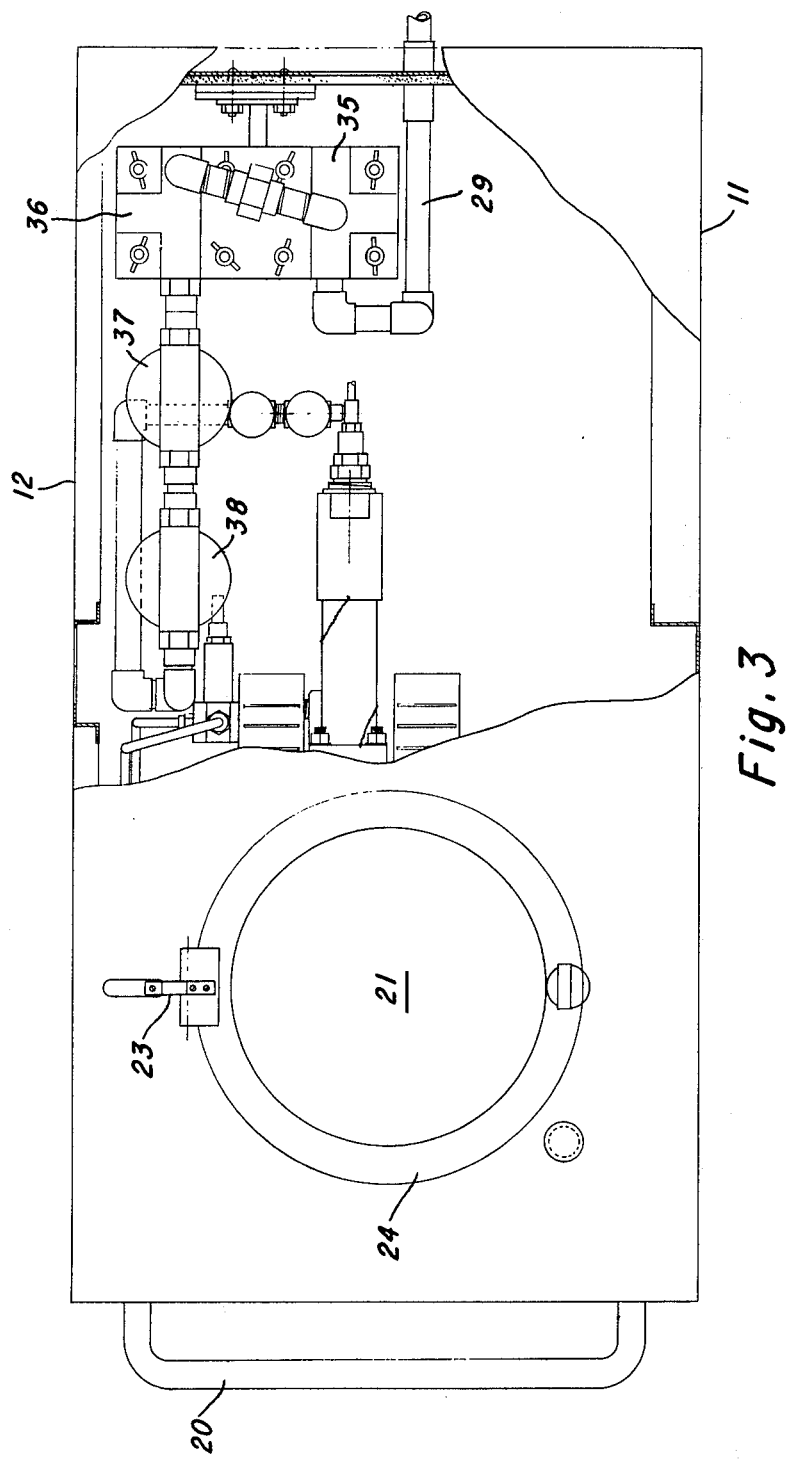
FIG. 3 is a plan view, partially broken away, of the apparatus shown in FIG. 1.

The housing 10 further includes a cover 21 associated with the top wall 15 thereof. In this connection, the top wall 15 of the housing 10 is provided with an opening therethrough to the interior of the housing. As shown, the opening in the top wall 15 is circular for receiving the cover 21 which is of dome shape thereabout. The dome-shaped cover 21 is preferably made of transparent material, such as plexiglass, to permit visual observation of the slice cleaning treatment to be effected by the apparatus as hereinafter described. A generally hemispherical receptacle 22 is mounted within the opening in the top wall 15 so as to extend within the housing 10, the receptacle 22 cooperating with the dome or cover 21 in defining a cleaning chamber therewithin. The receptacle 22 is provided with an annular mounting flange 22a affixed to the circumferential edge portion of the top wall 15 bounding the opening therein. The dome or cover 21 is mounted on the top wall 15 of the housing 10 by a hinge 23 (FIG. 3) for pivotal movement between open and closed positions with respect to the opening in the top wall 15 and the receptacle 22 therebeneath. The dome or cover 21 includes an annular marginal rim 24 for engagement with the annular mounting flange 22a of the receptacle 22 bounding the opening in the top wall 15 when in closed position. A suitable latching mechanism is provided for normally holding the dome 21 in closed position with respect to the receptacle 22. For example, the annular marginal rim 24 of the dome 21 may be made of a magnetic material adapted to be magnetically held in place by an electro-magnet associated with the annular mounting flange 22a which may be made of a magnetic material upon energization of the electro-magnet. Alternatively, the dome 21 may be held in closed position by a cam-actuated mechanical latch (not shown).

Beneath the dome 21 and mounted within the cleaning chamber so as to extend upwardly from the receptacle 22 is a pedestal 25 which presents a planar surface 26 for receiving the article whose exposed surface is to be cleaned. The article-supporting surface or slice-supporting surface 26 is provided with one or more apertures therethrough, these apertures communicating with passageways 27 formed in the pedestal 25 and adapted to communicate with a vacuum source as hereinafter described.

The pedestal 25 and the slice-supporting surface 26 thereof are mounted for rotation about a longitudinal axis which extends centrally through the slice-supporting surface 26, rotation being imparted to the pedestal 25 through suitable motive driving means. As shown, the rotation imparting means may comprise a motor 30 mounted within the housing 10 beneath the pedestal 25 and extending below the receptacle 22 through an opening provided in the bottom thereof. The motor 30 may be of an electric type or an air-operated type.

Figure 4:
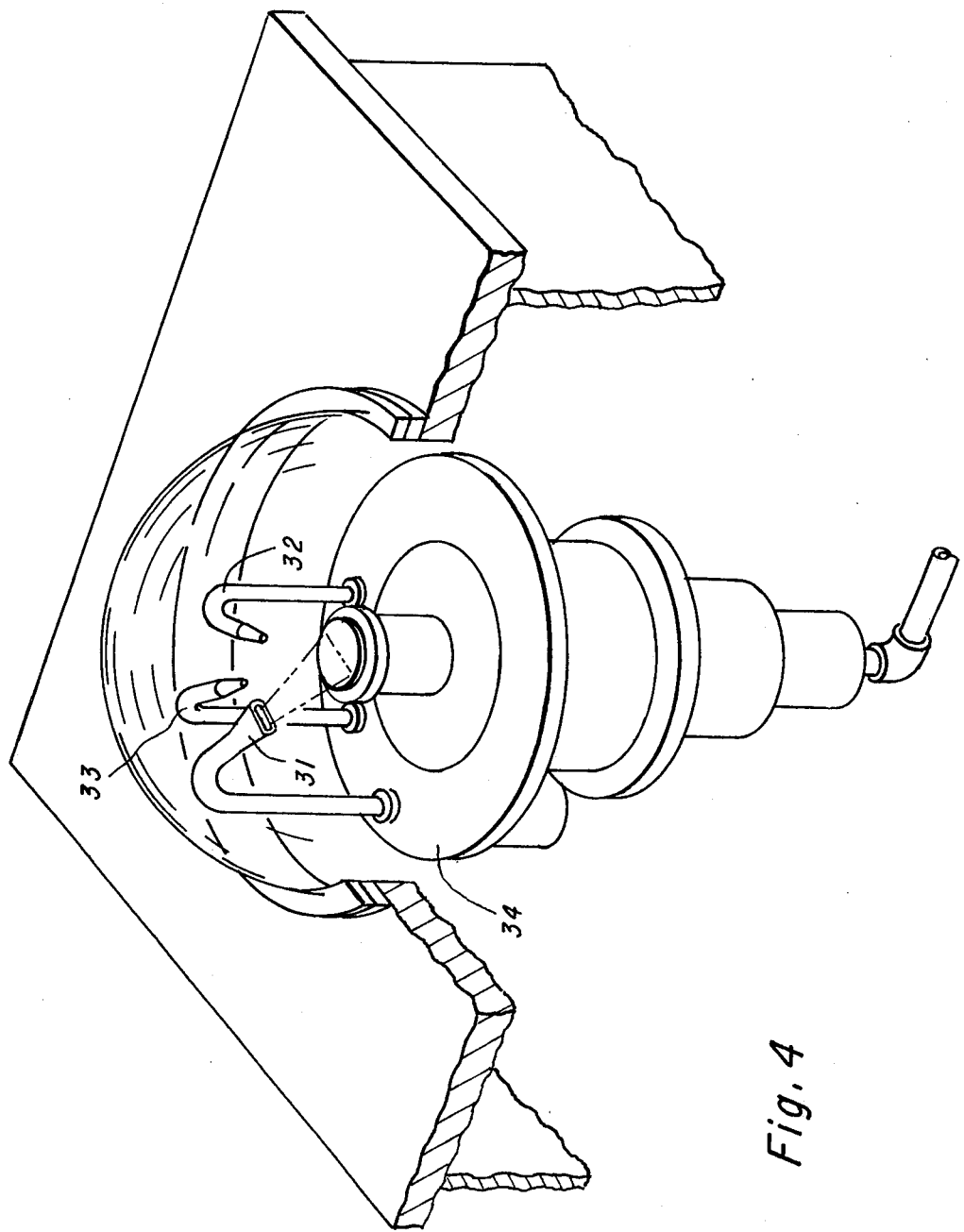
FIG. 4 is an enlarged perspective view, partially broken away, of a plural nozzle arrangement in relation to an upstanding pedestal on which the semiconductor slice to be cleaned is disposed and forming part of the apparatus shown in FIGS. 1–3.

Plural fluid nozzle means are provided in the cleaning chamber within the transparent dome-shaped cover 21, the plural fluid nozzle means being disposed above the level of the slice-supporting surface 26 in off-set angular relationship thereto and including a liquid spray-dispensing nozzle 31, a liquid rinse-dispensing nozzle 32, and a fluid drying stream-dispensing nozzle 33 arranged in spaced relationship above the slice-supporting surface 26 and about the circumference thereof (FIG. 4). Each of the nozzles 31, 32, and 33 is mounted on the downwardly curved end of a respective upstanding tube which is carried by a stationary platform 34. The stationary platform 34 is of annular configuration and is secured to the receptacle 22 within the cleaning chamber, with the upstanding rotary pedestal 25 extending through the central opening thereof. The respective upstanding tubes on which the nozzles 31, 32, and 33 are mounted pass through suitable openings provided in the stationary platform 34 and outwardly of the receptacle 22 through a fluid-tight seal 28 such that the cleaning chamber is maintained in a fluid-tight condition when the dome 21 is in closed position. The liquid spray-dispensing nozzle 31 has an orifice so shaped as to deliver a flat fan-shaped spray pattern of liquid at a relatively high pressure and velocity. Since it is important to remove surface debris from the semiconductor slice which may have a contaminating effect thereon, the liquid dispensed by the liquid spray-dispensing nozzle 31 is preferably de-ionized water, although it will be understood that any suitable organic or inorganic liquid which is substantially ion-free and of a nature inert to and non-injurious to the semiconductor material of the slice may be employed.

The second nozzle 32 also delivers a liquid stream, preferably deionized water, but at a relatively low pressure and velocity, to the surface of the semiconductor slice as a rinse, while the third nozzle 33 is connected by the tube associated therewith to a source of an inert gas, such as nitrogen, to serve as a drying means by directing an inert gaseous jet stream to the surface of the semiconductor slice being cleaned.

Figure 2:
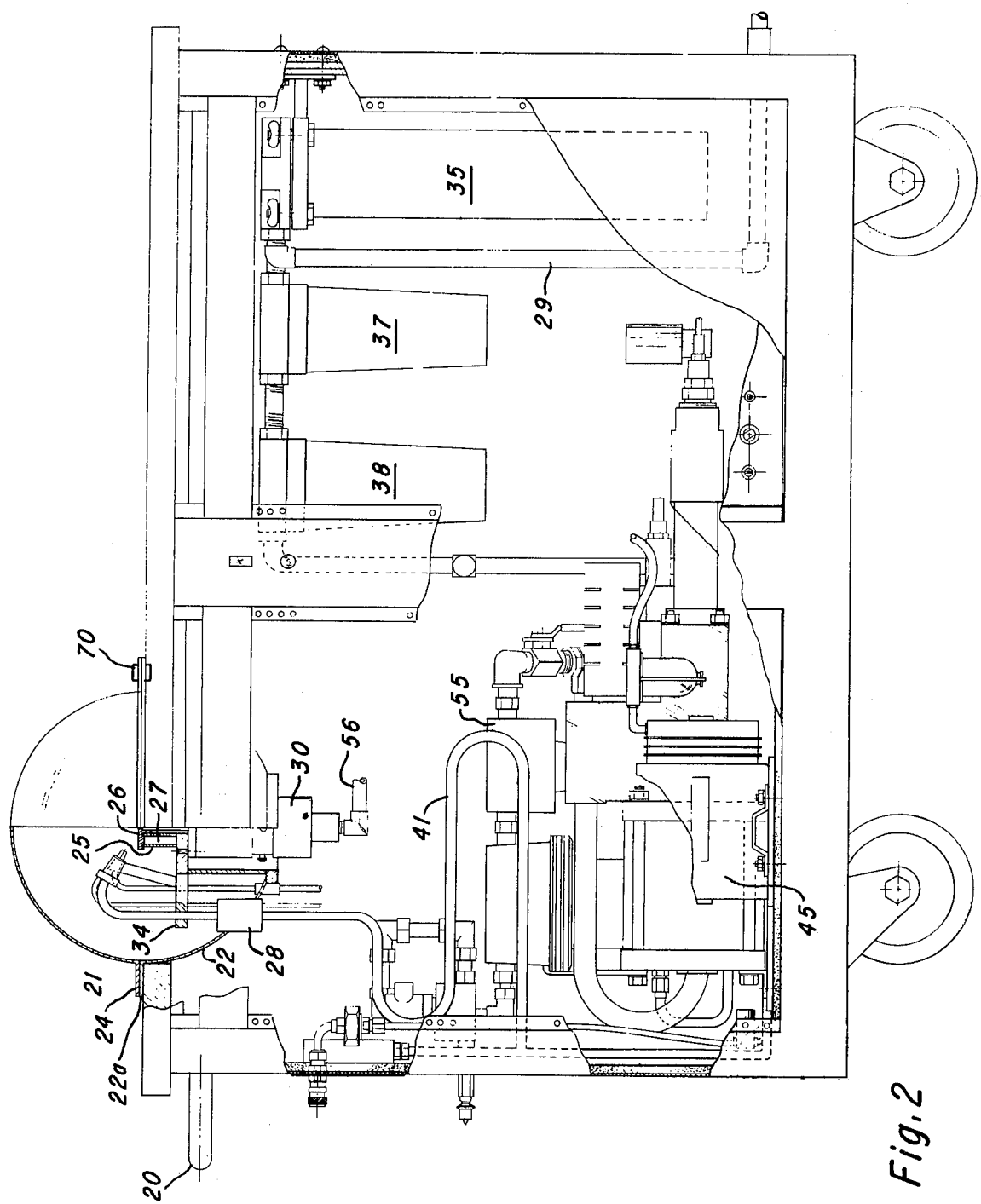
FIG. 2 is a front elevation, partially broken away, of the apparatus shown in FIG. 1.
Figure 5:
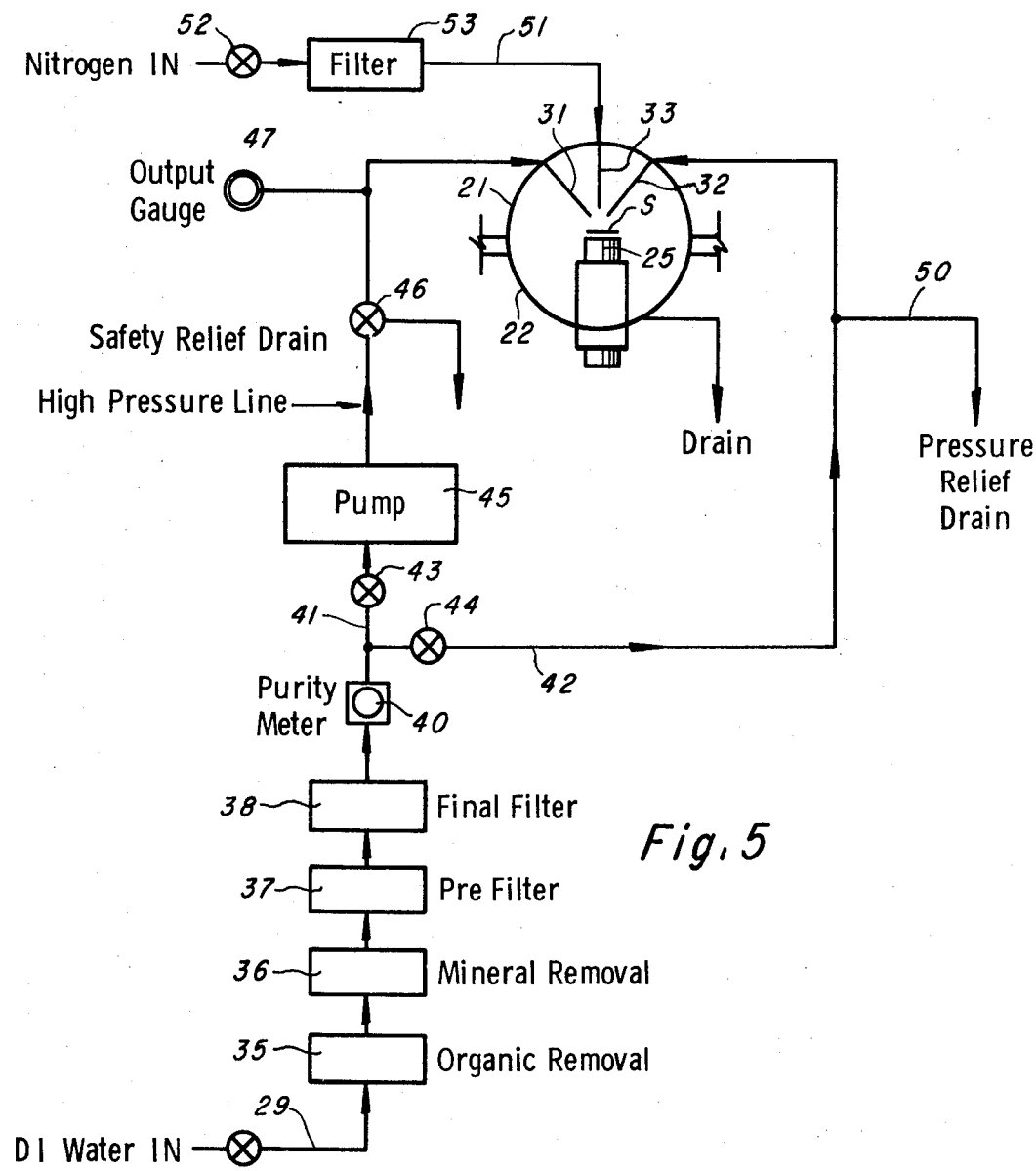
FIG. 5 is a schematic diagram of the apparatus shown in FIGS. 1–3.

As noted, the liquid spray-dispensing nozzle 31 is connected to a source of de-ionized water (FIG. 5) which may be located externally to the housing 10 or may be included in a sump (not shown) located within the housing 10 and re-cycled in repetitively performing the cleaning operation. As shown in FIG. 2, the de-ionized water is piped from an external source through an inlet or pipe 29 from where it may be directed through a series of filters to remove residual foreign matter therefrom for refinement of the de-ionized water to a preselected degree. In this connection, referring to FIG. 5, it will be observed that the de-ionized water is directed sequentially through filters 35, 36, 37, and 38 which are specifically constructed to filter out residual organic matter (filter 35) and residual mineral matter (filter 36), followed by further refined pre-filtering (filter 37), and the final filtering (filter 38) before the de-ionized water is introduced into the line leading to the tube on which the liquid spray-dispensing nozzle 31 is affixed. The respective filters are commerically available products, the filters 35 and 36 for organic and mineral removal being identified as Organic Removal Cartridge No. 5-27783 and Type M cartridge No. 5-27782 respectively and available from the Barnstead Company of 225 Rivermoor Street, Boston, Mass. The pre-filter 37 and final filter 38 may be of the type commercially available from the Gelman Instrument Company of Ann Arbor, Mich., as No. 12531 pre-filter and No. 12505 final filter, respectively. The deionized water upon being filterd is directed through a purity meter 40 to specifically determine if it is within the required purity range so as to avoid introducing contaminants onto the semiconductor slice.

The conduit 29 in which the de-ionized water flows then divides into branch conduits 41 and 42 which are respectively high pressure and low pressure lines. Each of the branch conduits 41, 42 includes an entrance valve therein which may be of the solenoid type moving from closed to open position upon energization of the solenoid thereof. In this connection, an entrance valve 43 is interposed in the branch conduit 41, while an entrance valve 44 is interposed in the branch conduit 42. The higher pressure branch conduit 41 communicates with the tube containing the liquid spray-dispensing nozzle 31 for delivering de-ionized water thereto at relatively high pressure of the order of 4,000 – 6,000 pounds per square inch. To this end, a compressed air-operated water pump 45 is provided in the branch conduit 41 to increase the pressure of the de-ionized water to be delivered to the liquid spray-dispensing nozzle 31. For safety purposes, a pressure relief valve 46 may be provided at the discharge end of the pump 45 to permit excessive pressure to be vented from the branch conduit 41 should the pressure exceed 8,000 lbs. per square inch, for example. A pressure gauge 47 is preferably installed in the high pressure branch conduit 41 on the discharge side of the pressure relief valve 46 to give an accurate indication of the pressure developed in the de-ionized water passing through the branch conduit 41 to the nozzle 31.

Following completion of the cleaning operation afforded by the liquid spray-dispensing nozzle 31, the valve 43 controlling the passage of liquid in the high pressure branch conduit 41 is closed, and the valve 44 controlling the passage of liquid in the low pressure branch conduit 42 is opened to permit the delivery of de-ionized water at a relatively low pressure to the rinse nozzle 32 which delivers the de-ionized water in a steady stream at relatively low pressure onto the surface of the semiconductor slice in the rinsing phase of the cleaning operation.

If desired, the low pressure branch conduit 42 may be provided with a bleed line 50 controlled by a valve 50a serving to relieve the pressure therein when the apparatus is not in operation by permitting the low pressure branch conduit 42 to be drained.

The third nozzle 33 is connected to a suitable source of an inert fluid, such as nitrogen. In this respect, the tube to which the nozzle 33 is affixed is connected to a gas conduit 51 leading to a source of nitrogen. A solenoid control valve 52 is provided in the conduit 51 at the entrance thereof, the valve 52 being operated in sequence with the valves 43, 44 for the branch conduits 41, 42 to admit nitrogen into the conduit 51, the nitrogen being dispensed through the nozzle 33 onto the semiconductor slice for drying the surface of the slice. A drying filter 53 in the form of a desiccant material may be included in the conduit 51 at the outlet side of the valve 52 for removing moisture and contaminating material from the nozzle gas prior to its use as a drying medium with the semiconductor slice.

The water pump 45 as shown in FIG. 2 is mounted on the bottom wall 16 within the housing 10, the pump 45 being suitably secured thereto. A vacuum pump 55 is mounted on top of the compressed air-operated water pump 45, the vacuum pump 55 having its intake end or suction end connected to the passageways 27 within the pedestal 25 by suitable tubing 56. It will be understood that operation of the vacuum pump 55 induces suction in the apertures provided in the slice-supporting surface 26 of the upstanding pedestal 25, this suction serving to retain a semiconductor slice in position on the surface 26 as the pedestal 25 and its surface 26 are undergoing rotation at a relatively high speed.

Referring to FIGS. 6 and 7, the liquid spray-dispensing nozzle 31 is shown schematically in an angular relationship with respect to the slice-supporting surface 26 of the upstanding pedestal 26 and a semiconductor slice S as disposed on the surface 26. Preferably, the liquid spray-dispensing nozzle 31 has an orifice of generally oval configuration so arranged as to deliver a flat fan-like spray pattern over an angle $\phi$ which may be of the order of 40°. The flat fan-shaped liquid spray pattern produced by the nozzle 31 is arranged to strike the exposed surface of the semiconductor slice S along a substantially linear path 60 coinciding with the diameter of the semiconductor slice S. Referring to FIG. 7, the nozzle 31 is off-set above the slice-supporting surface 26 and the semiconductor slice S thereon at an angle $\theta$ which preferably is in the range of 20°–60°. In a typical use of the apparatus herein disclosed for cleaning the exposed surface of a silicon slice, the liquid spray-dispensing nozzle 31 was off-set at an angle $\theta$ of approximately 30° with respect to the surface of the slice S and at a distance of 1 inch therefrom, while the pump 45 delivered de-ionized water to the nozzle 31 at 5,000 pounds per square inch pressure with the velocity of the de-ionized water discharged from the nozzle 31 being in the range of 150 – 200 feet per second.

Under these operating conditions, a bluish corona effect was noted in the region adjacent the surface of the slice being cleaned by the de-ionized water spray from the nozzle 31. The precise reason why this corona discharge occurs is not known, but a liquid pressure of sufficient magnitude lying within the range of approximately 4,000 – 6,000 lbs. per square inch is a necessary requisite of the de-ionized water delivered from the nozzle 31 to achieve the corona discharge. Although a liquid pressure higher than 6,000 lbs. per square inch in the de-ionized water delivered from the nozzle 31 will also produce a corona discharge, the higher liquid pressure may damage the surface of the slice and does not offer any additional advantage in cleaning. One possible theory to explain why the particular liquid spray delivered by the apparatus according to this invention is successful in removing particulate accumulated surface debris from the slice surface where the particle size of the surface debris is smaller than the width of the theoretically determined dead space layer or boundary layer associated with the slice surface, which would be expected to result in the failure of the cleaning operation to remove such small particles, is that the static electrical potential at the surface of the semiconductor slice is driven higher as the de-ionized water spray strikes the slice surface. According to this theory, as the static surface potential rises, the de-ionized water particles from the liquid spray are repelled from the surface, with the repulsion of these water particles aiding in dislodging the particulate surface debris from the surface of the slice. Once the initial adherence of the particulate surface debris to the slice surface is broken, the water spray then acts mechanically in washing the particles off of the slice surface. In this respect, the flat fan-shaped liquid spray delivered by the nozzle 31 to the surface of the slice S along a substantially linear path 60 coinciding with the diameter thereof acts in the nature of a sweeper, the angular off-set relationship of the nozzle 31 to the surface of the slice S providing a lateral component of motion to the liquid spray for sweeping the particulate surface debris away from the slice surface.

In a complete operating cycle of the apparatus as disclosed, the rinse nozzle 32 and the drying nozzle 33 are operated successively after the liquid spray-dispensing nozzle 31 has completed its operation. To this end, a cycle control switch 70 is provided for controlling the operation of the water pump 45 and the vacuum pump 55 while also controlling the successive operation of the three nozzles 31, 32, and 33. The cycle control switch 70 may include component parts thereof respectively mounted on the annular rim 24 of the dome-shaped cover 21 and on the annular flange 22a of the receptacle 22. Thus, the cycle control switch 70 is adapted to be closed when the cover 21 is moved to a position closing the opening in the top wall 15 of the housing 10 with its annular marginal rim 24 in latched engagement with the annular flange 22a of the receptacle 22. Conversely, when the latch holding the cover 21 in closed position is released, such as by deenergization of the electro-magnet, movement of the cover 21 to an open position also opens the cycle control switch 70, thereby discontinuing the operation of the apparatus.

In operating the apparatus, the liquid spray-dispensing nozzle 31 may deliver the flat spray of de-ionized water at high pressure and velocity onto the surface of the slice S through a time period on the order of 30 seconds or less, followed in succession by a rinse cycle wherein the nozzle 32 delivers de-ionized water at low pressure and velocity to the surface of the slice S for a period of like duration, and by a drying cycle in which in inert gas, such as nitrogen, is delivered by the nozzle 33 to the semiconductor slice S as a jet stream over a time period approximating 10 seconds or less. Preferably, the motor 30 is programmed to increase its speed during the drying cycle so as to impart an increased rate of rotation to the pedestal 25 and the semiconductor slice S thereon as the jet stream of drying gas is directed thereagainst so as to assist the drying of the slice surface by increased centrifugal force. For example, the rate of rotation of the pedestal 25 during the cleaning and rinsing phases may be maintained in the range of 4,000 – 5,000 rpms., while the rate of rotation during the drying phase may be maintained in the range of 6,000 – 7,000 rpms.

Although the apparatus has been shown in a form requiring the manual deposit and removal of the semiconductor slice S in and from the cleaning chamber defined by the dome-shaped cover 21 and the receptacle 22, it will be understood that suitable means may be employed to automatically introduce semiconductor slices within the cleaning chamber and to remove such slices from the chamber following the complete cleaning cycle. Moreover, the article being cleaned could be other than a semiconductor slice. In this respect, the technique disclosed herein has been employed for cleaning debris from the surface of a photomask and in general is applicable in cleaning the surface of any article where even minutely-sized particles retained thereon as debris would be detrimental.

While this invention has been described in relation to a preferred illustrated embodiment thereof, it is to be understood that various changes, substitutions, and alterations may be made therein without departing from the spirit and scope of the invention which is defined by the appended claims.

What is claimed is:

1. An apparatus for cleaning the surface of a slice of semiconductor material, said apparatus comprising:
    a member providing a surface on which a slice of semiconductor material to be cleaned is adapted to be placed,
    means for imparting rotation to said member about an axis extending centrally through the slice-supporting surface thereof,
    means for retaining the slice upon said slice-supporting surface of said member when rotary movement is imparted thereto,
    means disposed in off-set relationsip to the level of said slice-supporting surface for dispensing a liquid spray onto the exposed surface of a slice positioned on said slice-supporting surface at a predetermined angular relationship with respect thereto,
    said spray dispensing means including a spray nozzle disposed above the level of said slice-supporting surface, said nozzle having a spray-dispensing orifice therein so constructed as to produce a flat fan-shaped spray pattern for striking the exposed surface of a slice positioned on said slice-supporting surface with liquid spray along a linear path coinciding with the diameter of the slice, said nozzle being arranged in relation to the level of said slice-supporting surface to deliver the liquid spray at an angle lying within a range of 20° to 60° with respect to said slice-supporting surface.
    a source of de-ionized water, said source of de-ionized water being operably connected to said nozzle such that de-ionized water is employed as the liquid spray to be dispensed from said nozzle onto the exposed surface of the semiconductor slice, and
    control means for regulating the pressure and velocity of the liquid delivered by said nozzle against the exposed surface of the semiconductor slice supported on said slice-supporting surface to effect a cleaning operation thereon removing particulate surface debris of a particle size smaller than the width of the theoretically determined dead space layer associated with the exposed slice surface.

2. An apparatus as set forth in claim 1, further including filtering means interposed between said source of deionized water and said nozzle for removal of residual organic and mineral foreign matter from the de-ionized water prior to its introduction into said nozzle for delivery as a liquid spray to the exposed surface of the semiconductor slice.

3. An apparatus as set forth in claim 1, wherein said nozzle is positioned at an angle of 30° with respect to the level of said slice-supporting surface.

4. An apparatus as set forth in claim 1, wherein the spray-dispensing orifice in said nozzle has a configuration for generating a fan-shaped spray pattern 40° in width.

5. A method of cleaning a surface of a slice of semiconductor material, said method comprising:
    rotating the semiconductor slice about an axis extending through a central point thereof,
    delivering de-ionized water as a liquid spray to a major surface of the semiconductor slice in a flat fan-shaped spray pattern striking the surface of the slice along a linear path coinciding with the diameter of the slice at a controlled pressure and velocity with the liquid spray striking the surface of the semiconductor slice at an angle lying within a range of 20° to 60° with respect thereto, and
    regulating the pressure and velocity of the liquid spray within a predetermined range to produce a corona discharge in the region adjacent the surface of the semiconductor slice in response to the striking of the liquid spray against the surface of the semiconductor slice for effecting a cleaning action on the surface of the semiconductor slice removing particulate surface debris of a particle size smaller than the width of the dead space layer theoretically associated with the surface of the semiconductor slice.

6. A method as set forth in claim 5, further including filtering the de-ionized water for removal of residual organic and mineral foreign matter therefrom prior to delivering the de-ionized water as a liquid spray to the surface of the semiconductor slice.

7. A method as set forth in claim 5, wherein the pressure and velocity of the liquid spray delivered to the surface of the semiconductor slice is regulated to produce a pressure in the liquid lying within the range of 4,000 – 6,000 lbs. per square inch at a velocity in the range of 150–200 feet per second.

8. A method as set forth in claim 5, wherein the fan-shaped spray pattern in which the liquid is delivered to the surface of the slice is 40° in width from its point of origin.

* * * * *